United States Patent
Zhang et al.

(10) Patent No.: US 8,999,843 B2
(45) Date of Patent: Apr. 7, 2015

(54) SEMICONDUCTOR DEVICE AND FABRICATING METHOD THEREOF

(71) Applicant: Semiconductor Manufacturing International Corporation (Shanghai), Shanghai (CN)

(72) Inventors: Steven Zhang, Shanghai (CN); Liya Fu, Shainghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 13/927,830

(22) Filed: Jun. 26, 2013

(65) Prior Publication Data
US 2014/0084377 A1    Mar. 27, 2014

(30) Foreign Application Priority Data
Sep. 24, 2012    (CN) .......................... 2012 1 0358628

(51) Int. Cl.
| | |
|---|---|
| H01L 21/44 | (2006.01) |
| H01L 29/417 | (2006.01) |
| H01L 21/768 | (2006.01) |
| H01L 21/8238 | (2006.01) |
| H01L 29/78 | (2006.01) |
| H01L 23/485 | (2006.01) |

(52) U.S. Cl.
CPC .... *H01L 29/41725* (2013.01); *H01L 21/76879* (2013.01); *H01L 21/823814* (2013.01); *H01L 29/7845* (2013.01); *H01L 23/485* (2013.01); *H01L 21/76808* (2013.01); *H01L 21/76816* (2013.01); *H01L 21/76877* (2013.01); *H01L 21/823807* (2013.01); *H01L 21/823871* (2013.01); *H01L 29/78* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 6,025,259 | A * | 2/2000 | Yu et al. | 438/618 |
| 6,433,428 | B1 * | 8/2002 | Watanabe et al. | 257/750 |
| 2009/0321837 | A1 * | 12/2009 | Wei et al. | 257/368 |

* cited by examiner

*Primary Examiner* — Yasser A Abdelaziez
(74) *Attorney, Agent, or Firm* — Innovation Counsel LLP

(57) ABSTRACT

A semiconductor device and method of fabricating the device are provided, the method including providing an insulating layer, wherein the insulating layer covers an active region and a gate of at least one semiconductor device; forming connection holes to the active region in the insulating layer to expose at least part of the active region, wherein the connection holes include a first portion of a first width and a second portion of a second width, the first portion of the connection holes being adjacent to the active region, and the first width being less than the second width; filling the connection holes with a metal material to form the contacts to the active region. As such, contacts formed for the active region also include a first portion of a first width and a second portion of a second width.

10 Claims, 8 Drawing Sheets

SEMICONDUCTOR DEVICE AND FABRICATING METHOD THEREOF

CROSS-REFERENCE TO RELATED APPLICATIONS

This application claims priority from CN201210358628.X filed on Sep. 24, 2012 and entitled "SEMICONDUCTOR DEVICE AND FABRICATING METHOD THEREOF", which is incorporated herein by reference in its entirety.

BACKGROUND

1. Field of the Invention

The present disclosure relates a semiconductor device and a fabricating method thereof.

2. Description of the Related Art

Presently, in Back-End-of-Line (BEOL) processes, after a semiconductor device has been formed it is necessary to form an insulating layer on the active region layer of the semiconductor device. Contacts to the active region are formed by making connection holes in the insulating layer in at least a portion of the active region, and then filling the connection holes with a metal material.

FIG. 1a and FIG. 1b illustrate a method for forming the above contacts with a Damascene process in the prior art.

First of all, an insulating layer 101 is etched to form connection holes 102, so that an active region (not shown in the figure) is exposed, as shown in FIG. 1a.

The connection holes 102 are filled with a metal material to form contacts 103 to the active region. Next, chemical mechanical polishing is performed to planarize the surface of the semiconductor device that has been formed, as shown in FIG. 1b.

In FIG. 1a, the reference label 104 indicates a photoresist layer, and the reference label 106 represents an interlayer, and reference label 105 represents a structure, for instance a gate, of a semiconductor device.

With the development of semiconductor fabrication industry, the size of semiconductor devices designed and fabricated is becoming smaller and smaller, leading to the further scaling-down in width of the active contacts 103. The effect of dual stress liner (DSL) on channel stress enhancement has been greatly reduced, which may cause the degradation of channel stress performance.

In order to overcome such a defect, a technical solution of tensile trench contact has been proposed to enhance channel stress for N-MOS (Negative-Mental-Oxide-Semiconductor). However, such a solution does not produce a satisfied effect. Meanwhile, this solution is only applicable to N-MOS, and is unsuitable for P-MOS (Positive-Mental-Oxide-Semiconductor).

SUMMARY

According to one aspect, a method of fabricating a semiconductor device is provided that includes providing an insulating layer on the semiconductor device, wherein the insulating layer covers an active region and a gate on the semiconductor device; forming at least one connection hole in the insulating layer to expose at least a portion of the active region, wherein the at least one connection hole includes a first portion having a first width and a second portion having a second width, wherein the first portion of the connection hole is adjacent to the active region, and the first width is less than the second width; and filling the connection hole with a metal material to form a contact to the active region.

Forming at least one connection hole may include etching the insulating layer to form an opening of the first width to expose the at least a portion of the active region; and etching the insulating layer at the opening to widen a portion of the opening to the second width.

Forming at least one connection hole may include applying a photoresist layer on the surface of the insulating layer, the photoresist layer having a window of the first width on the surface of the insulating layer, etching the insulating layer using the photoresist layer with the window to form the opening having the first width; filling a Bottom Anti-Reflective Coating (BARC) within the opening having the first width; widening the window of the photoresist layer to the second width, and then etching the insulating layer using the photoresist layer with the window having the second width to widen a portion of the opening; and removing the BARC.

The height of the first portion of the connection hole may be larger than the height of the gate.

The metal material may have at least one of a compressive stress and a tensile stress.

The semiconductor device may include at least a first type of transistor and a second type of transistor, wherein the metal material used for the first type of transistor is a first metal material having a first type of stress, and the metal material used for the second type of transistor is a second metal material having a second type of stress.

Forming the connection hole may include etching the insulating layer to form the connection hole for the first type of transistor, filling the first metal material in the connection hole and performing chemical mechanical polishing (CMP); and etching the insulating layer to form the connection hole for the second type of transistor, filling the second metal material in the connection hole and performing CMP.

Forming the connection hole may include etching the insulating layer to form connection holes for a first type of transistors and a second type of transistors, respectively; blocking the connection holes for the second type of transistors with a mask and filling the connection holes for the first type of transistors with the first metal material; and blocking the connection holes for the first type of transistors with a mask and filling the connection holes for the second type of transistors with the second metal material; and performing CMP to planarize the surface.

The first type of transistor may be a P-MOS transistor and the first metal material is a metal material having compressive stress; and the second type of transistor may be an N-MOS transistor and the second metal material maybe a metal material having tensile stress.

The first width may be in a range from 20 nm to 50 nm, and the second width is in a range from 30 nm to 100 nm.

A depth of the connection hole may be in a range of 500 Å to 2000 Å.

In another aspect, a semiconductor device is provided, the semiconductor device including an insulating layer, wherein the insulating layer covers an active region and a gate on the semiconductor device; at least one contact to the active region, formed in the insulating layer; wherein the contact includes a first portion having a first width and a second portion having a second width, and wherein the first portion of the contact is adjacent to the active region, and the first width is less than the second width.

A height of the first portion of the contact may be larger than a height of the gate.

The at least one semiconductor device may include at least a first type of transistor and a second type of transistor, wherein the connection hole in the active region of the first type of transistor is filled with a first metal material having a first type of stress, and the connection hole in the active region of the second type of transistor is filled with a second metal material having a second type of stress.

The first type of transistor may be P-MOS transistor, and the first metal material is a metal material having compressive stress;

The second type of transistor may be N-MOS transistor, and the second metal material is a metal material having tensile stress.

The first width may be in a range from 20 nm to 50 nm, the second width is in a range from 30 nm to 100 nm.

A depth of the connection hole may be 500 Å to 2000 Å.

The semiconductor device may include at least a first type of transistor and a second type of transistor, wherein the connection hole in the active region of the first type of transistor is filled with a first metal material having a first type of stress, and the connection hole in the active region of the second type of transistor is filled with a second metal material having a second type of stress.

The first type of transistor may be P-MOS transistor, and the first metal material is a metal material having compressive stress; the second type of transistor may be N-MOS transistor, and the second metal material is a metal material having tensile stress.

The first type of transistor may be N-MOS transistor, the first metal material is a metal material having tensile stress; and the second type of transistor may be a P-MOS transistor, the second metal material is a metal material having compressive stress.

Other features and advantages will become apparent from the detailed description of exemplary embodiments given below with reference to accompanying drawings.

BRIEF DESCRIPTION OF THE DRAWINGS

The accompanying drawings, which are incorporated in and constitute a part of the specification, illustrate embodiments and, together with the description, serve to explain the principles of the disclosure.

With reference to those drawings, from the following detailed description, this disclosure can be understood more clearly, wherein.

DESCRIPTION OF THE EMBODIMENTS

Figure 1A:
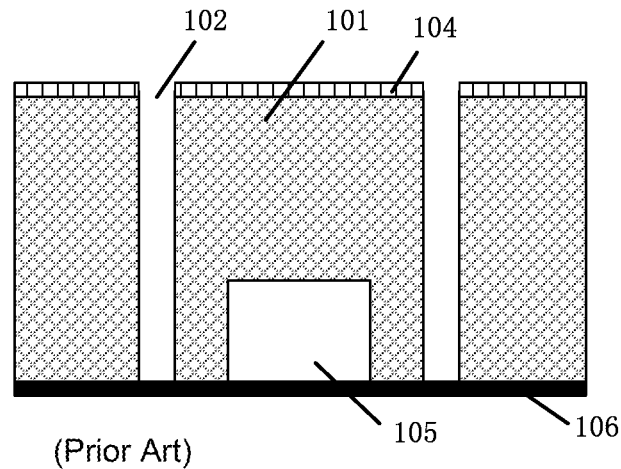
FIG. 1A and FIG. 1B are schematic diagrams of fabricating a semiconductor device in the prior art.

Various exemplary embodiments will now be described in detail with reference to the drawings. It should be noted that the relative arrangement of the components and steps, the numerical expressions, and numerical values set forth in these embodiments do not limit the scope of the present disclosure unless it is specifically stated otherwise.

It should be appreciated that, for the convenience of description, various parts shown in those drawings are not necessarily drawn on scale.

The following description is merely illustrative in nature and is in no way intended to limit the disclosure, its application, or uses.

Techniques, methods and apparatus that are known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it need not be further discussed for following figures.

Figure 1B:
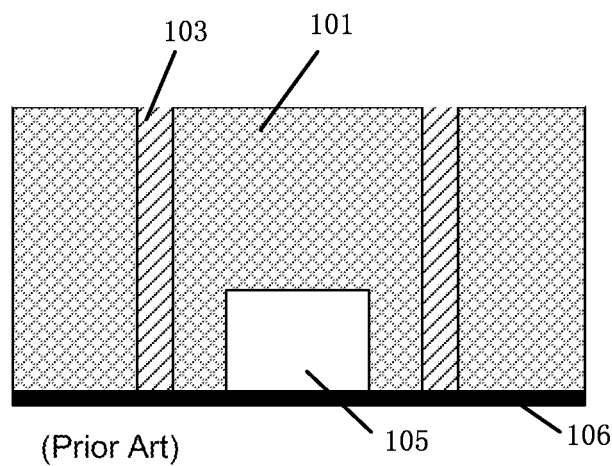

As shown in FIG. 1b, as the size of semiconductor devices decreases, the space available for contacts to the active region becomes smaller and smaller. It can be envisaged that the size of the contacts has to be reduced accordingly. Furthermore, if the original size of the contacts remains unchanged, there may be insufficient space to accommodate those contacts. Additionally, the contacts may affect the gate 105. Improper proximity of the contact 103 to the gate 105 may cause the contacts 103 to contact the gate 105, leading to the failure of the semiconductor device. However, such downsized contacts degrade the stress effect.

In order to address the above and other problems, a technical solution of employing contacts with varied sizes is provided in this disclosure. Particularly, due to the presence of the gate, the size of a portion of the contact is reduced to adapt the contact to the decreased space. On the other hand, as can be seen in FIG. 1b, above the height of the gate, there is still space available for contacts with an increased size. As such, enlarged contacts can improve channel stress performance. The embodiments described herein employ active region contacts that have non-uniform sizes (varied sizes). Using contacts with non-uniform sizes keeps good channel stress performance, while allowing the size of a semiconductor device to be reduced.

Example embodiments will be described hereinafter.

Figure 2:
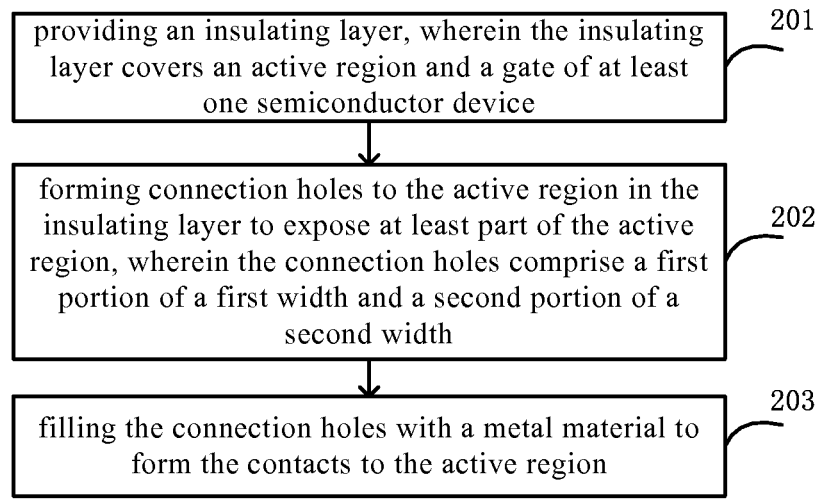
FIG. 2 is a schematic diagram of a semiconductor device fabricating method according to an embodiment.

FIG. 2 is a schematic diagram of a semiconductor device fabricating method according to an embodiment. As shown in FIG. 2, the semiconductor device fabricating method provided in this embodiment includes the following.

At 201, an insulating layer is provided. The insulating layer covers the active region and a gate of at least one semiconductor device.

At 202, at least one connection hole to the active region is formed in the insulating layer to expose at least a part of the active region, wherein the connection hole has a first portion of a first width and a second portion of a second width, the first portion of the connection hole being adjacent to the active region, and the first width being smaller than the second width.

At 203, a metal material is filled in the connection hole to form contact for the active region.

With the semiconductor device fabricating method shown in FIG. 2, because the connection hole formed in the insulating layer has a particular shape, the resulting contact formed also has the shape. In particular, because the connection hole formed in the insulating layer includes a first portion having the first width and a second portion having the second width, and the first width being smaller than the second width, the contact formed for the active region also includes a first portion having a first width and a second portion having a second width, and the first width being smaller than the second width. Only the first portion of the connection hole, and resulting contact, has a smaller width and is adjacent to the active region. Thus, the width of active region contact can be increased, and channel stress performance can be improved.

The first width is, for example, in a range of 20 nm to 50 nm, and the second width is, for example, in a range of 30 nm to 100 nm.

They depth of the connection holes may be 500 Å to 2000 Å.

Forming connection holes as set forth in FIG. 2 at 202 may include the following.

The insulating layer is etched to form an opening having a first width and to expose the active region.

Next, on the basis of the formed opening having the first width, the insulating layer is etched again to widen a portion of the opening to a second width.

Here, a portion of the opening that has not been widened is the first portion of the connection hole, and the widened portion of the opening is the second portion of the connection hole.

When the height of the first portion of the connection holes is larger than the height of the gate, a short circuit due to the connection of the second portion of the connection holes and the gate can be prevented.

FIG. 3a to FIG. 3g are process drawings of a method of fabricating a semiconductor device according to an embodiment of this disclosure.

Figure 3A:
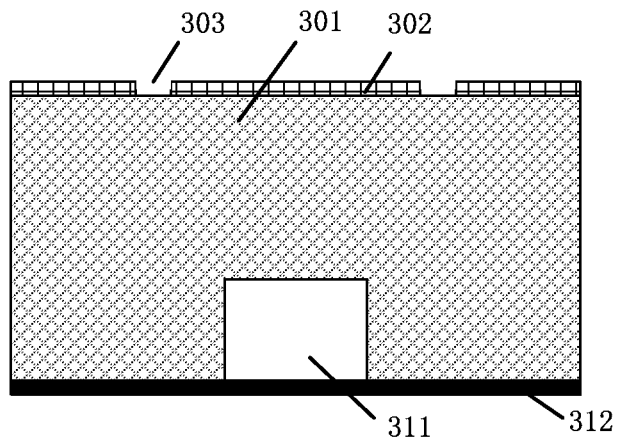
FIG. 3a to FIG. 3g are process drawings of a method of fabricating a semiconductor device according to an embodiment.

A photoresist layer 302 with a window 303 having a first width is applied on the surface of the insulating layer 301, as shown in FIG. 3a.

Figure 3B:
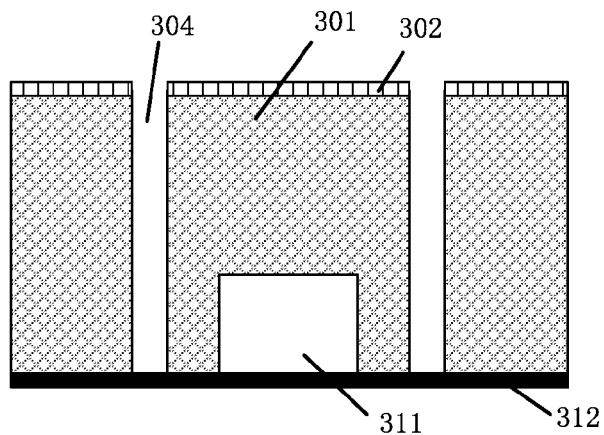

Next, the insulating layer 301 is etched using the photoresist layer 302 with the window 303 having the first width to form an opening 304 having the first width. A portion of the active region is thus exposed, as shown in FIG. 3b.

Figure 3C:
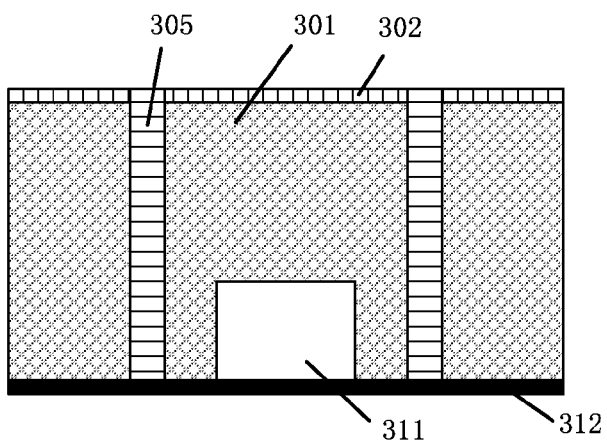

Then, a Bottom Anti-Reflective Coating (BARC) 305 is filled in the opening 304, as shown in FIG. 3c.

Figure 3D:
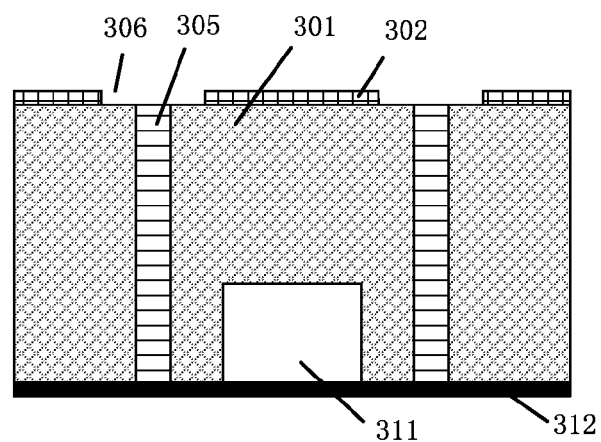

The opening of the photoresist layer 302 is widened to a second width 306, as shown in FIG. 3d.

Figure 3E:
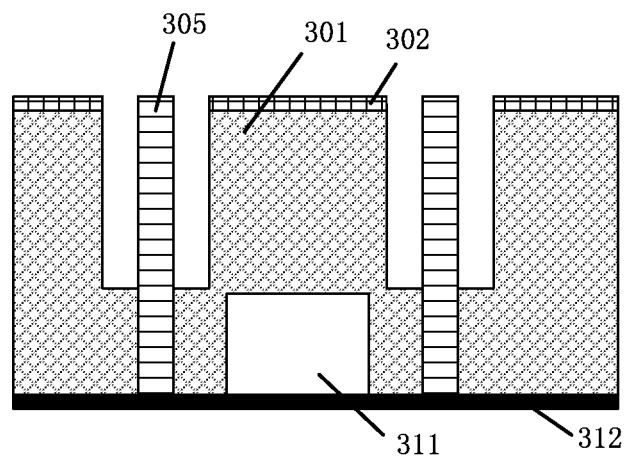

The insulating layer 301 is etched using the photoresist layer with the widened window 306 having the second width to widen a portion of the opening 303, as shown in FIG. 3e.

Figure 3F:
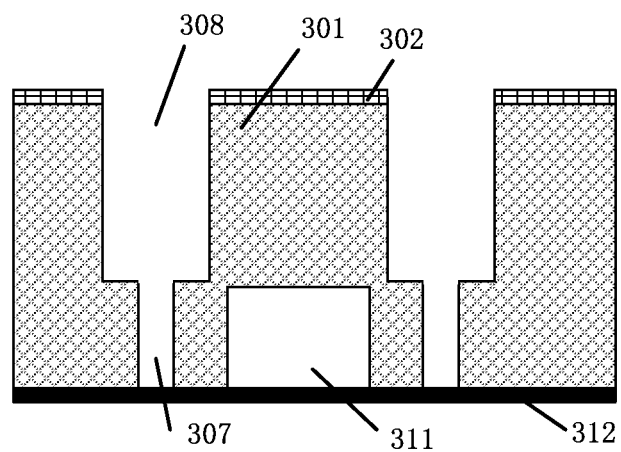

The BARC 305 is removed to expose the underlying active region (not shown), as shown in FIG. 3f.

At that point, the portion of the opening that has not been widened is the first portion 307 of the connection holes, and the widened portion of the opening is the second portion 308 of the connection holes.

Figure 3G:
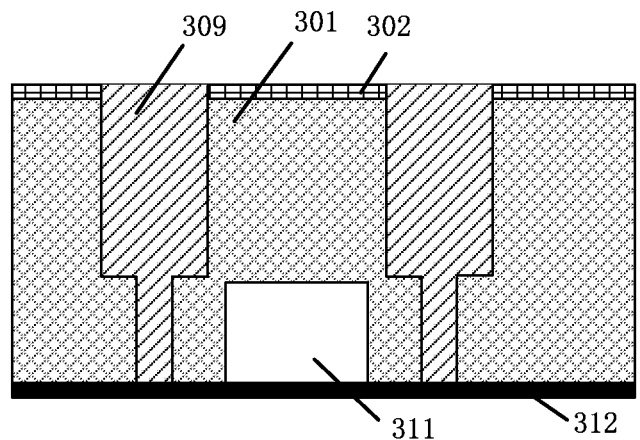

A metal material is filled in the connection hole to form contact 309 for the active region, as shown in FIG. 3g. As shown in FIG. 3g, the contact 309 is formed conformally to the connection hole (i.e., it conforms to the shape of the connection hole), which includes the first portion of the first width (corresponding to the open portion 307) and the second portion of the second width (corresponding to the open portion 308).

Chemical mechanical polishing is then performed to planarize the surface of the formed semiconductor device.

In FIGS. 3a-3g, the reference label 311 represents a gate, and the reference label 312 represents an interlayer. The interlayer 312 is, for example, a layer of silicide for reducing the contact resistance to the active region, and may be formed on or over a substrate of the semiconductor device.

In the above embodiment, the semiconductor device may be, for example, a P-MOS transistor, or an N-MOS transistor. However, this disclosure is not limited to the above two kinds of semiconductor devices. Those skilled in the art may understand that the teachings disclosed herein are fully applicable to other situations where stress enhancement is required.

When the semiconductor device is a P-MOS transistor, the metal material is a metal material having compressive stress. Alternatively, when the semiconductor device is an N-MOS transistor, the metal material is a metal material having tensile stress.

The, the semiconductor device may include transistors of a first type and transistors of a second type at the same time, in which a metal material having a first stress type can be filled in connection holes for active regions of the first type of transistors, and a metal material having a second stress type can be filled in connection holes for active regions of the second type of transistors.

When the fabrication process is used for forming two different types of transistors, the contacts to the active regions can be formed, for example, by first etching the connection holes for the active regions of the first type of transistor and filling the first type of metal, and then etching the connection holes for the active regions of the second type of transistor and filling the second type of metal. In another embodiment, the contacts to the active regions can be formed simultaneously etching the connection holes for the active regions of the first type of transistor and the connection holes for the active regions of the second type of transistor, and then filling the first type of metal for the first type of transistor and the second type of metal for the second type of transistor, respectively.

FIGS. 4a-4d are process drawings of a method of fabricating a semiconductor device according to another embodiment. In this embodiment, the connection hole to an active region of a first type of transistor is etched followed by the filling of a first type of metal material, and then the connection hole to an active region of a second type of transistors is etched, followed by the filling of a second type of metal material.

Figure 4A:
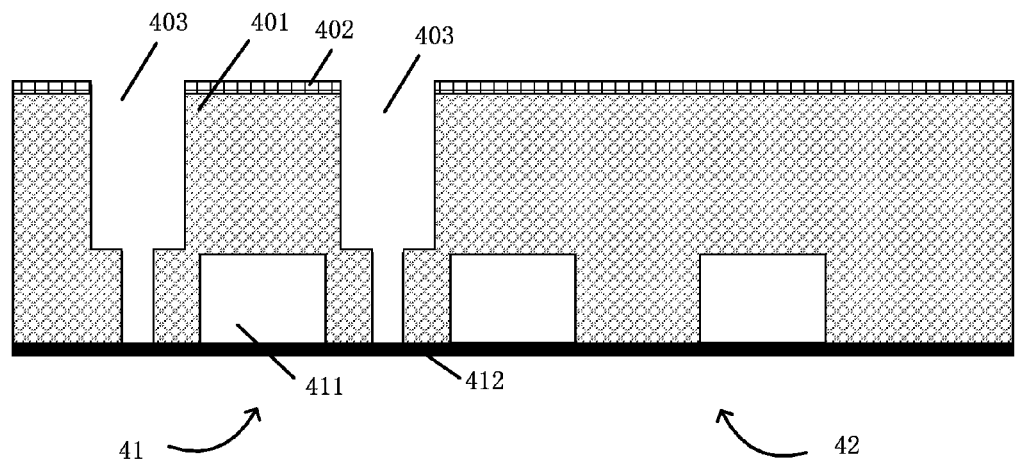
FIG. 4a to FIG. 4d are process drawings of a method of fabricating a semiconductor device according to another embodiment.

Connection holes 403 are formed by etching an insulating layer 401 for a first type of transistors 41, as shown in FIG. 4a.

The connection holes 403 can be formed, for example, according to the embodiment shown in FIGS. 3a to 3f.

Figure 4B:
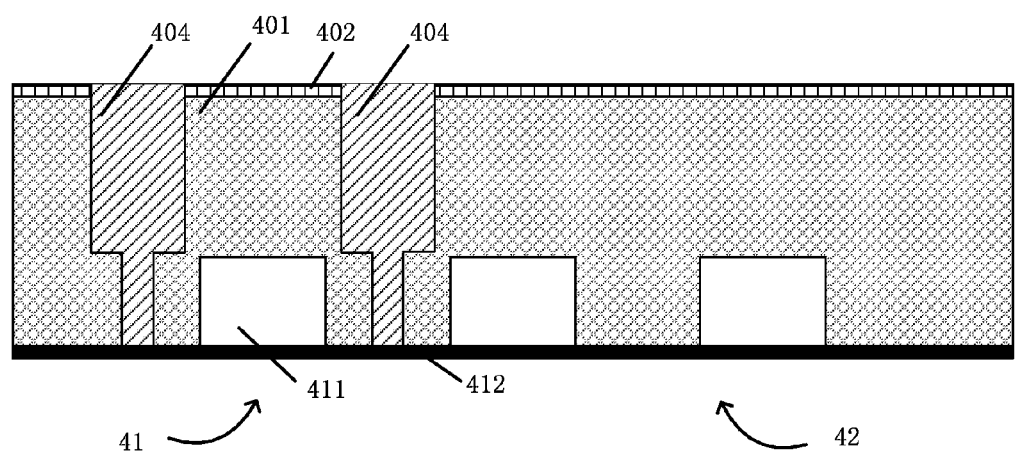
Figure 4C:
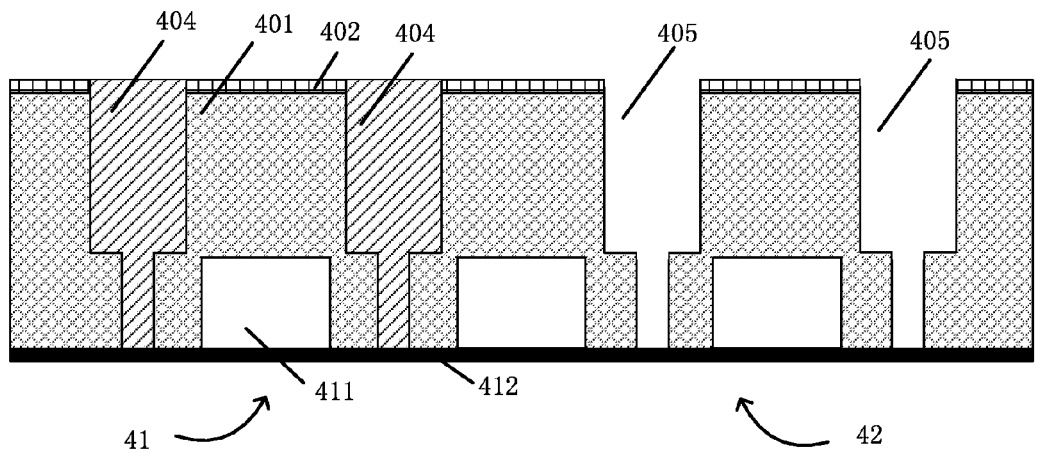

Next, a metal material having a first type of stress is filled in the connection holes 403 to form first contacts 404 for the first type of transistors 41, as shown in FIG. 4b, and then chemical mechanical polishing is performed.

Then, connection holes 405 are formed through etching in the insulating layer 401 for a first type of transistors 42, as shown in FIG. 4a.

The connection holes 405 can be formed, for example, according to the embodiment shown in FIGS. 3a to 3f.

Figure 4D:
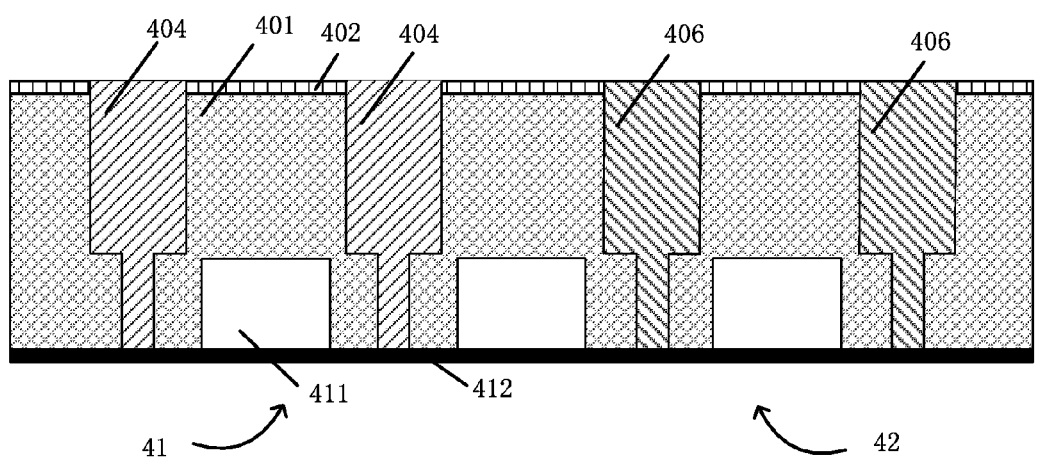

Then, a metal material having a second type of stress is filled in the connection holes to form first contacts 406 for the second type of transistors 42, as shown in FIG. 4d, and then chemical mechanical polishing is performed.

In FIGS. 4a-4d, the reference label 402 represents a photoresist layer, the reference label 411 represents a gate, and the reference label 412 represents an interlayer. For example, a layer of silicide is provided on the interlayer 412.

The above embodiment shows an example in which active region contacts for different types of semiconductor devices are formed successively. Those skilled in the art may understand that the technique of the embodiments of this disclosure can be adopted to form active region contacts for different types of semiconductor devices. In this embodiment, it does not matter what actually the types of semiconductor devices and the sequence of forming contacts for a particular type of semiconductor devices are. For example, in an embodiment, a first transistor representative of a semiconductor device may be a PMOS transistor, and a second transistor representative of another semiconductor device may be a NMOS transistor, and vice versa. In an embodiment, active region contacts for PMOS transistors can be formed first. In another embodiment, active region contacts for NMOS transistors can be formed first.

For a PMOS transistor, contact holes are filled with a compressive stress metal. For a NMOS transistor, contact holes are filled with a tensile stress metal.

FIG. 5a to FIG. 5d are process drawings of a method of fabricating a semiconductor device according to another embodiment. In this embodiment, connection holes for the active regions of a first type of transistor and the active regions of a second type of transistor are formed simultaneously.

Figure 5A:
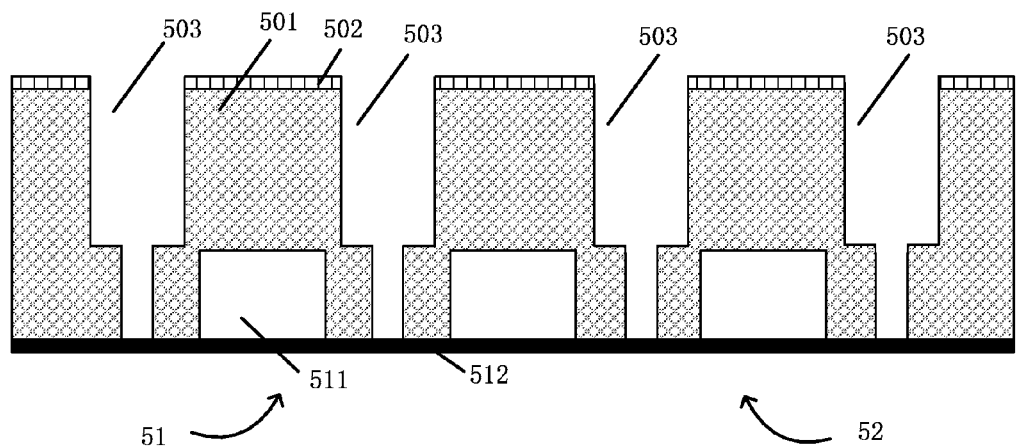
FIG. 5a to FIG. 5d are process drawings of a method of fabricating a semiconductor device according to still another embodiment.

Connection holes 503 are formed in an insulating layer 501 by etching the first type of transistor 51 and the second type of transistor 52, as shown in FIG. 5a.

Figure 5B:
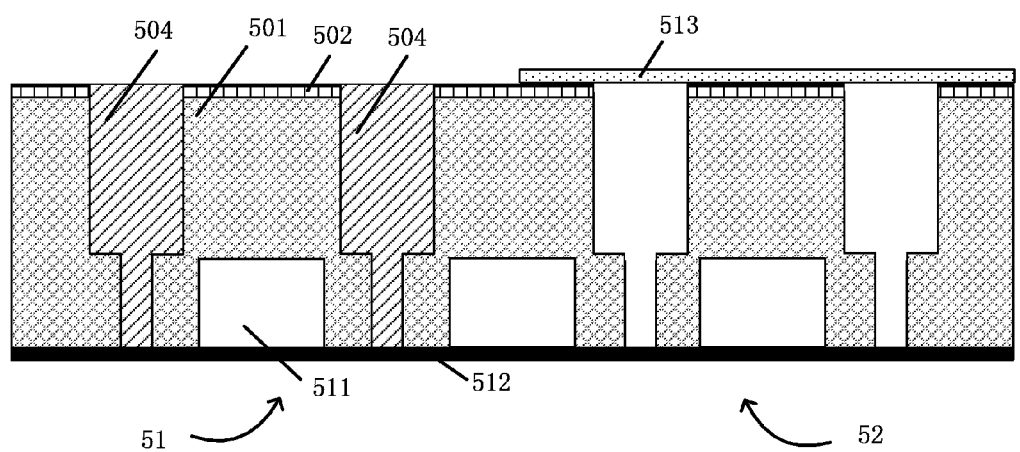

Next, connection holes for the second type of transistor 52 are blocked using for example a mask or barrier 513. A metal material having a first type of stress is filled in the connection holes for the first type of transistor 51, which are not blocked with mask or barrier 513, to form first contacts 504 for the first type of transistor 51, as shown in FIG. 5b.

Figure 5C:
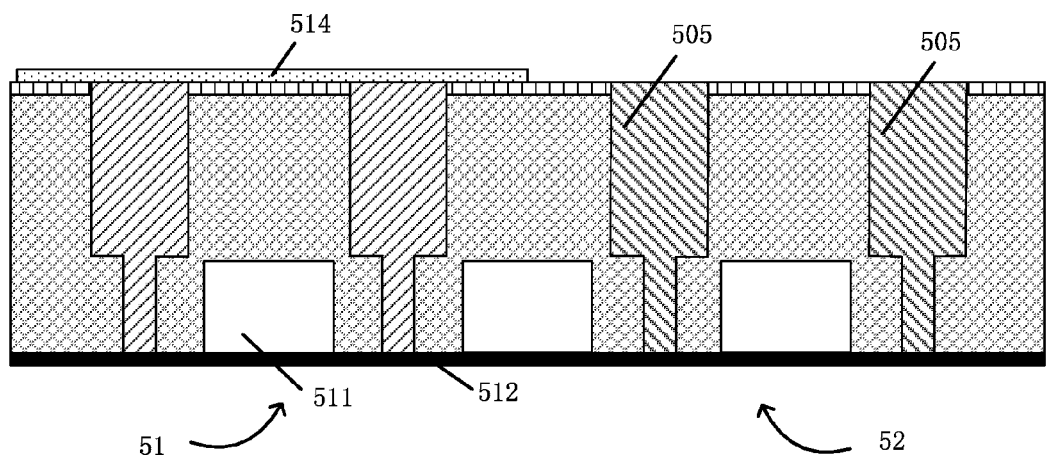

Then, connection holes for the first type of transistor 51 are blocked using, for example, the mask or barrier 513. A metal material having a second type of stress is filled in the connection holes for the second type of transistor 52, which are not blocked with mask or barrier 513 to form second contacts 505 for the second type of transistor 52, as shown in FIG. 5c.

Figure 5D:
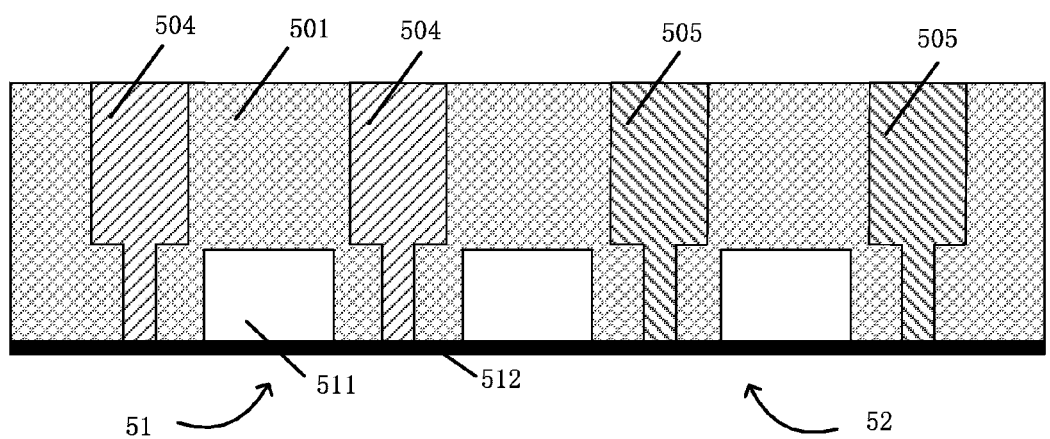

Chemical mechanical polishing is then performed to planarize the surface of the semiconductor devices, as shown in FIG. 5d.

In FIGS. 5a-5d, the reference label 502 represents a photoresist layer, the reference label 511 represents a gate, and the reference label 512 represents an interlayer. For example, a layer of silicide is provided on the interlayer 512.

In this embodiment, because all connection holes may have the same structure, it is possible to form connection holes for all semiconductor devices directly and at the same time. After that, metals having different types of stress can be filled for the different semiconductor devices, respectively.

Those of ordinary skill in the art will understand that there may be other steps that are included in the process herein.

Through the various embodiments described above, the obtained semiconductor device includes: an insulating layer, in which the insulating layer covers an active region and a gate of at least one semiconductor device; and at least one contact to the active region, formed in the insulating layer. The contact includes a first portion having a first width and a second portion having a second width, the first portion of the contact being adjacent to the active region of the semiconductor device, and the first width being less than the second width.

Because the contacts to the active region include a first portion having a first width and a second portion having a second width, and the first width is less than the second width, the width of the active region contacts can be increased and channel stress performance can be improved.

Thus, the method for fabricating a semiconductor device and the resulting semiconductor device have been described. Certain details that are well known and understood by those of ordinary skill in the art are not described herein in order to prevent obscuring the concept of this disclosure. From the above description, those of ordinary skill in the art may fully understand how to implement the technical solutions disclosed herein.

Although some specific embodiments of the present disclosure have been demonstrated in detail with examples, it should be understood by a person of ordinary in the art that the above examples are only intended to be illustrative but not to limit the scope of the present disclosure. For example, as to the widening of the photoresist layer in FIG. 3d, the widening can be done as described above, or the photoresist layer with the window of the first width can be removed, and a new photoresist layer with a window of a second width can be applied. Such embodiments should be also conceived to be covered in the scope of this disclosure.

Those skilled in the art will understand that modifications to the above embodiments can be made without departing from the scope and spirit of this disclosure, including the appended claims.

What is claimed is:

1. A method of fabricating a semiconductor device, comprising:
   providing an insulating layer on the semiconductor device, wherein the insulating layer covers an active region and a gate on the semiconductor device;
   forming at least one connection hole in the insulating layer, wherein the at least one connection hole includes a first portion having a first width and a second portion having a second width, wherein the first portion of the connection hole is adjacent to the active region, and the first width is less than the second width; and
   filling the connection hole with a metal material to form a contact to the active region, wherein forming at least one connection hole comprises:
      applying a photoresist layer on the surface of the insulating layer, the photoresist layer having a window of the first width on the surface of the insulating layer, etching the insulating layer using the photoresist layer with the window to form the opening having the first width;
      filling a Bottom Anti-Reflective Coating (BARC) within the opening having the first width;
      widening the window of the photoresist layer to the second width, and then etching the insulating layer using the photoresist layer with the window having the second width to widen a portion of the opening; and
      removing the BARC.

2. The method according to claim 1, wherein forming at least one connection hole comprises:
   etching the insulating layer to form an opening of the first width; and
   etching the insulating layer at the opening to widen a portion of the opening to the second width.

3. The method according to claim 1, wherein the height of the first portion of the connection hole is larger than the height of the gate.

4. The method according to claim 1, wherein the metal material has at least one of a compressive stress and a tensile stress.

5. The method according to claim 1, wherein,
   the semiconductor device comprises at least a first type of transistor and a second type of transistor, wherein the metal material used for the first type of transistor is a first metal material having a first type of stress, and the metal material used for the second type of transistor is a second metal material having a second type of stress.

6. The method according to claim 5, wherein forming the connection hole comprises:
   etching the insulating layer to form the connection hole for the first type of transistor, filling the first metal material in the connection hole and performing chemical mechanical polishing (CMP); and
   etching the insulating layer to form the connection hole for the second type of transistor, filling the second metal material in the connection hole and performing CMP.

7. The method according to claim 5, wherein forming the connection hole comprises:
- etching the insulating layer to form connection holes for a first type of transistors and a second type of transistors, respectively;
- blocking the connection holes for the second type of transistors with a mask and filling the connection holes for the first type of transistors with the first metal material; and
- blocking the connection holes for the first type of transistors with a mask and filling the connection holes for the second type of transistors with the second metal material; and
- performing CMP to planarize the surface.

8. The method according to claim 5, wherein the first type of transistor is P-MOS transistor, the first metal material is a metal material having compressive stress; and the second type of transistor is N-MOS transistor, the second metal material is a metal material having tensile stress.

9. The method according to claim 1, wherein the first width is in a range from 20 nm to 50 nm, and the second width is in a range from 30 nm to 100 nm.

10. The method according to claim 1, wherein a depth of the connection hole is in a range of 500 Å to 2000 Å.

* * * * *